US012777894B2

(12) United States Patent
Ko et al.

(10) Patent No.: US 12,777,894 B2
(45) Date of Patent: Oct. 27, 2026

(54) METHOD OF SPLITTING SEMICONDUCTOR CHIP USING MECHANICAL MACHINING AND SEMICONDUCTOR CHIP SPLIT BY THE SAME

(71) Applicant: SAMSUNG ELECTRONICS CO., LTD., Suwon-si (KR)

(72) Inventors: Yeongkwon Ko, Suwon-si (KR); Seunghun Shin, Suwon-si (KR); Jihun Jung, Suwon-si (KR); Junyeong Heo, Suwon-si (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 416 days.

(21) Appl. No.: 18/371,774

(22) Filed: Sep. 22, 2023

(65) Prior Publication Data

US 2024/0312823 A1 Sep. 19, 2024

(30) Foreign Application Priority Data

Mar. 13, 2023 (KR) ........................ 10-2023-0032414

(51) Int. Cl.

| | |
|---|---|
| ***H01L 21/683*** | (2006.01) |
| ***H10D 84/08*** | (2025.01) |
| ***H10P 72/00*** | (2026.01) |
| ***H10P 72/70*** | (2026.01) |

(52) U.S. Cl.

CPC ......... *H10P 72/7402* (2026.01); *H10D 84/08* (2025.01); *H10P 72/0428* (2026.01); *H10P 72/0442* (2026.01); *H10P 72/742* (2026.01)

(58) Field of Classification Search

CPC ........... H01L 21/6836; H01L 21/67092; H01L 21/67132; H01L 2221/68336; H01L 21/78; H01L 23/544; H01L 23/564; H01L 2223/54426; H10D 84/08

See application file for complete search history.

(56) References Cited

U.S. PATENT DOCUMENTS

| | | | |
|---|---|---|---|
| 5,136,354 | A | 8/1992 | Morita et al. |
| 6,521,975 | B1 | 2/2003 | West et al. |
| 8,298,963 | B2 | 10/2012 | Akiba et al. |
| 8,648,444 | B2 | 2/2014 | Chen et al. |

(Continued)

FOREIGN PATENT DOCUMENTS

| | | | |
|---|---|---|---|
| JP | 2005-252196 | A | 9/2005 |
| KR | 10-2008-0088668 | A | 10/2008 |

(Continued)

*Primary Examiner* — Karen Kusumakar
(74) *Attorney, Agent, or Firm* — Sughrue Mion, PLLC

(57) ABSTRACT

Provide is a method of splitting a semiconductor chip, the method including performing a back-end-of-line (BEOL) process including forming a plurality of chip areas on a semiconductor substrate, forming a splitting area, which separates the plurality of chip areas, on the semiconductor substrate, and forming a wire on a first surface of the semiconductor substrate, forming a cutout auxiliary layer in the splitting area of the first surface of the semiconductor substrate, and performing mechanical machining by bringing a mechanical machining device into contact with the cutout auxiliary layer, wherein the cutout auxiliary layer is adjacent to the plurality of chip areas.

15 Claims, 14 Drawing Sheets

(56) References Cited

U.S. PATENT DOCUMENTS

| | | | | |
|---|---|---|---|---|
| 9,105,706 | B2 * | 8/2015 | Otsuka | H01L 23/585 |
| 9,484,239 | B2 | 11/2016 | Graf et al. | |
| 9,728,477 | B2 * | 8/2017 | Wu | H01L 23/10 |
| 2005/0202650 | A1 | 9/2005 | Imori et al. | |
| 2008/0036042 | A1 | 2/2008 | Sano et al. | |
| 2009/0272973 | A1 | 11/2009 | Yoshida et al. | |
| 2018/0240832 | A1 | 8/2018 | Iwafuchi | |
| 2019/0265291 | A1 | 8/2019 | Kwon et al. | |
| 2020/0126930 | A1 | 4/2020 | Cho et al. | |
| 2021/0050264 | A1 * | 2/2021 | Won | H01L 23/585 |
| 2022/0016768 | A1 * | 1/2022 | Tseng | B25J 19/028 |
| 2022/0262743 | A1 * | 8/2022 | Chang | H10W 42/121 |
| 2023/0317546 | A1 * | 10/2023 | Brun | H10W 40/22 |

FOREIGN PATENT DOCUMENTS

| | | | |
|---|---|---|---|
| KR | 10-2019-0102759 | A | 9/2019 |
| KR | 10-2020-0044357 | A | 4/2020 |

* cited by examiner

METHOD OF SPLITTING SEMICONDUCTOR CHIP USING MECHANICAL MACHINING AND SEMICONDUCTOR CHIP SPLIT BY THE SAME

CROSS-REFERENCE TO RELATED APPLICATION

This application claims priority to Korean Patent Application No. 10-2023-0032414 filed in the Korean Intellectual Property Office on Mar. 13, 2023, the entirety of which are incorporated herein by reference.

BACKGROUND

1. Field

Embodiments of the present disclosure relate to a method of splitting a semiconductor chip using mechanical machining and a semiconductor chip split by the same, and more particularly, to a method of splitting a semiconductor chip using mechanical machining such as sawing or scribing, and a semiconductor chip split by the same.

2. Description of Related Art

Methods of cutting a wafer, on which active areas and circuit elements such as lines are formed, into chips include a mechanical cutting method using a dicing saw or scriber having a diamond tip, and a method using a laser.

A dicing saw is a cutting device that completely cuts a wafer or forms a groove having a relatively large width corresponding to a width of a disk-shaped blade having a diamond tip by rotating the blade. A scriber is a device that forms a scribe line, which has a relatively very small width and a predetermined depth, on a wafer by rectilinearly reciprocating a scriber tip having a diamond tip. However, in the case of the mechanical cutting method, an organic material is attached to a cutting blade or scriber tip, which may cause gradual deterioration in cutting/machining performance or cause W-shaped uneven abrasion with an increase in number of times the cutting blade or scriber tip is used. For this reason, chippings or cracks may be formed on a cut surface.

SUMMARY

One or more embodiments may improve reliability of a method of splitting a semiconductor chip using mechanical machining.

One or more embodiments may maintain machining performance of a blade or scriber tip used for a method of splitting a semiconductor chip using mechanical machining.

According to an aspect of an embodiment, there is provide a method of splitting a semiconductor chip, the method including performing a back-end-of-line (BEOL) process including forming a plurality of chip areas on a semiconductor substrate, forming a splitting area, which separates the plurality of chip areas, on the semiconductor substrate, and forming a wire on a first surface of the semiconductor substrate, forming a cutout auxiliary layer in the splitting area of the first surface of the semiconductor substrate, and performing mechanical machining by bringing a mechanical machining device into contact with the cutout auxiliary layer, wherein the cutout auxiliary layer is adjacent to the plurality of chip areas.

According to another aspect of an embodiment, there is provide a semiconductor chip including a semiconductor substrate, a plurality of wiring layers on the semiconductor substrate, a plurality of interlayer insulating films between the plurality of wiring layers, a plurality of gap-filling insulating films on the plurality of interlayer insulating films, and a cutout auxiliary layer residual portion on the plurality of interlayer insulating films, wherein the cutout auxiliary layer residual portion extends along an outer periphery of the semiconductor substrate and surrounds the plurality of gap-filling insulating films.

According to another aspect of an embodiment, there is provide a semiconductor chip including a semiconductor substrate, an active area including a plurality of wiring layers and a plurality of circuit elements on the semiconductor substrate, a moistureproof structure adjacent to the active area, a chip dam adjacent to the moistureproof structure, a plurality of interlayer insulating films between the plurality of wiring layers, a plurality of gap-filling insulating films on the plurality of interlayer insulating films, a cutout auxiliary layer residual portion on the plurality of interlayer insulating films, and a trench between the plurality of gap-filling insulating films and the cutout auxiliary layer residual portion, wherein the cutout auxiliary layer residual portion extends along an outer periphery of the semiconductor substrate and surrounds the plurality of gap-filling insulating films.

BRIEF DESCRIPTION OF DRAWINGS

The above and other aspects, features, and advantages of the embodiments will be more clearly understood from the following detailed description, taken in conjunction with the accompanying drawings, in which.

DETAILED DESCRIPTION OF EMBODIMENTS

Figure 1:
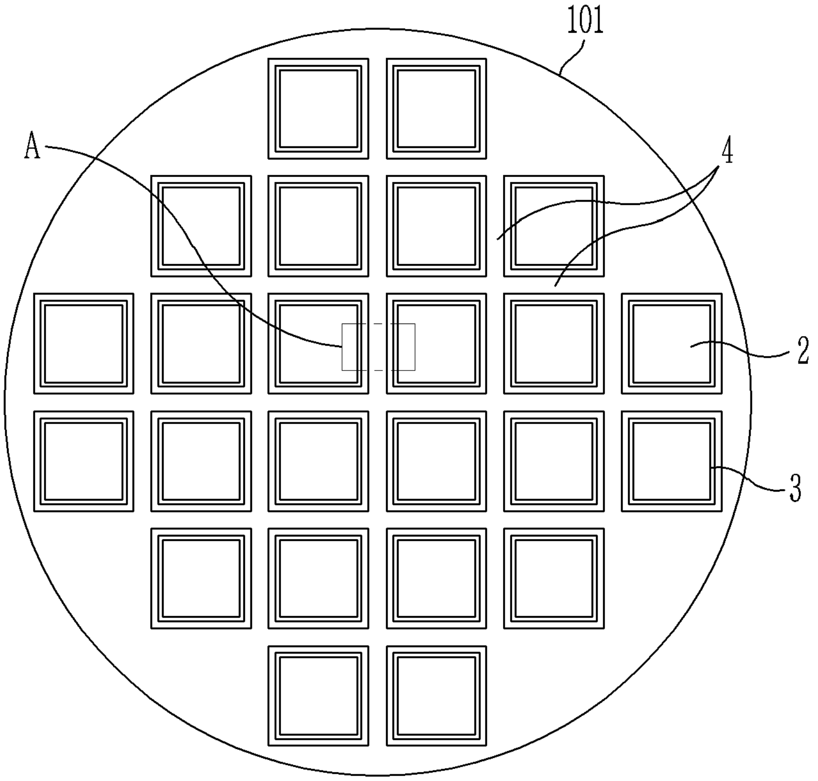
FIG. 1 illustrates a wafer having chips to be split by a mechanical method of splitting a semiconductor chip according to an embodiment.

Then, embodiments of the present disclosure will be described in detail with reference to the accompanying drawings so that those with ordinary skill in the art to which the present disclosure pertains may easily carry out the embodiments. However, the present disclosure may be implemented in various different ways and is not limited to the embodiments described herein.

Embodiments described herein are example embodiments, and thus, the disclosure is not limited thereto.

The drawings and descriptions should be considered illustrative in nature and not restrictive. Like reference numerals indicate like components throughout the specification.

The size and thickness of each component illustrated in the drawings are shown for ease of description, but the present disclosure is not necessarily limited to the contents illustrated in the drawings. In drawings, thicknesses of layers, films, plates, areas, etc. may be exaggerated for clarity. In the drawings, for understanding and ease of description, the thickness of some layers and areas is exaggerated.

The singular expressions used in the present specification are intended to include the plural expressions unless the context clearly dictates otherwise.

In the specification and claims, the term "and/or" is intended to include any combination of the terms "and" and "or" for the purpose of meaning and interpretation. For example, the words "A and/or B" may be interpreted as "A, B, or A and B".

In the specification and claims, the phrase "at least one of" is intended to include, for purposes of meaning and interpretation, a meaning of "at least one selected from a group of". For example, "at least one of A and B" may be understood to mean "A, B, or A and B".

While terms such as first, second, and the like may be used in the present specification to describe various components, such components are not limited by such terms. These terms are used only to distinguish one component from another component. For example, a first component may be named a second component, and similarly, the second component may also be named the first component, without departing from the scope of the present disclosure.

When an element, such as a layer, film, area, or substrate, is referred to as being "on" another element, the element may be directly on the other element, or there may also be an intervening element. In contrast, when an element is referred to as being "directly on" another element, there is no intermediate element. Also, throughout the specification, the term "above" a target element is to be understood as an element being located above or below the target element, and does not necessarily mean "above" with respect to the opposite direction of gravity.

For example, spatially relative terms "below," "above," and the like may be used to facilitate describing the relationship of one element or component to another as illustrated in the drawing. It should be understood that the spatially relative terms encompass different orientations of the constituent elements in use or operation in addition to the orientation depicted in the drawings. For example, if the constituent element in the drawings is turned over, the constituent element described as being "below" or "beneath" the other constituent element may be placed "above" the other constituent element. Thus, the exemplary term "below" can encompass both orientations of above and below. Devices may also be directed in different directions, so spatially relative terms may be interpreted differently depending on the directions.

When an element (or area, layer, portion, etc.) is referred to in the specification as being "connected" or "coupled" to another element, the element may be directly disposed, connected, or coupled to the other element mentioned above, or an integral element may be disposed therebetween.

The terms "connected to" or "coupled to" may include physical or electrical connection or coupling.

Unless otherwise defined, all terms used in the present specification (including technical and scientific terms) have the same meaning as commonly understood by one of ordinary skill in the technical field to which the present disclosure pertains. The terms such as those defined in a commonly used dictionary should be interpreted as having meanings consistent with meanings in the context of related technologies and should not be interpreted as ideal or excessively formal meanings unless explicitly defined in the present specification.

Figure 2:
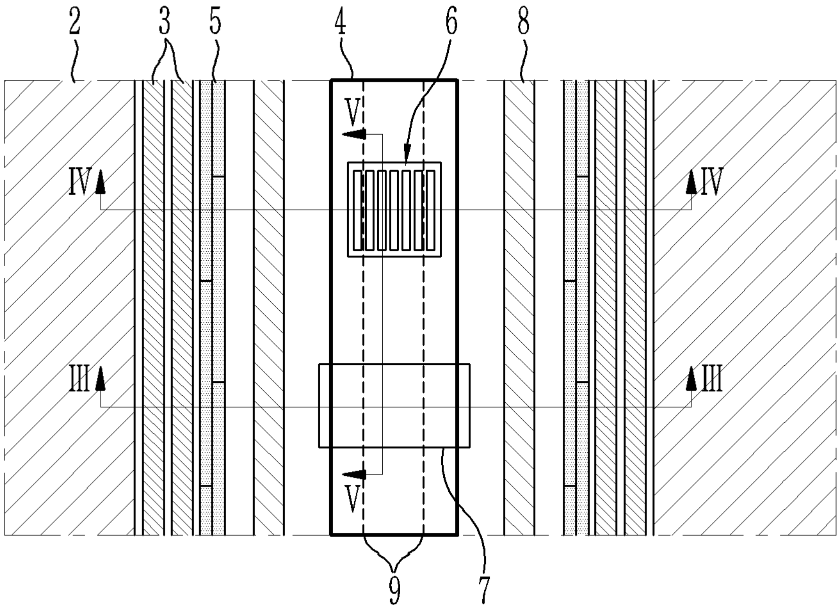
FIG. 2 is an enlarged view of part A in FIG. 1.
Figure 3:
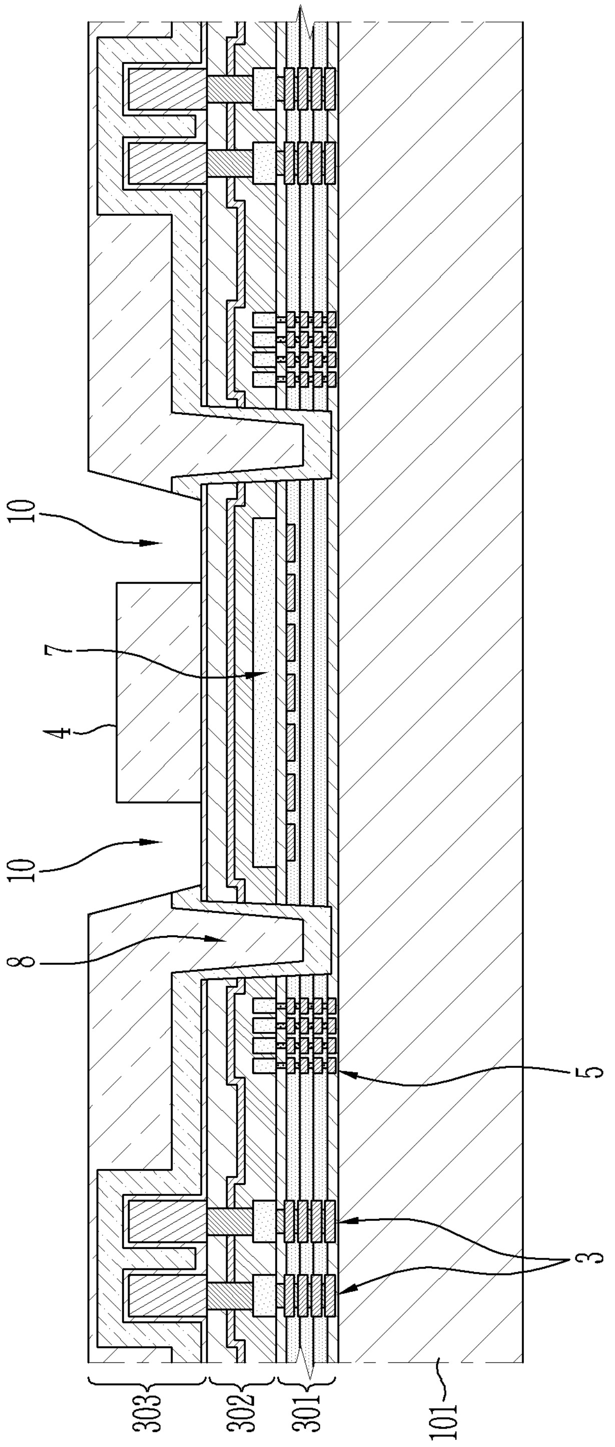
FIG. 3 is a cross-sectional view taken along line III-III in FIG. 2.
Figure 4:
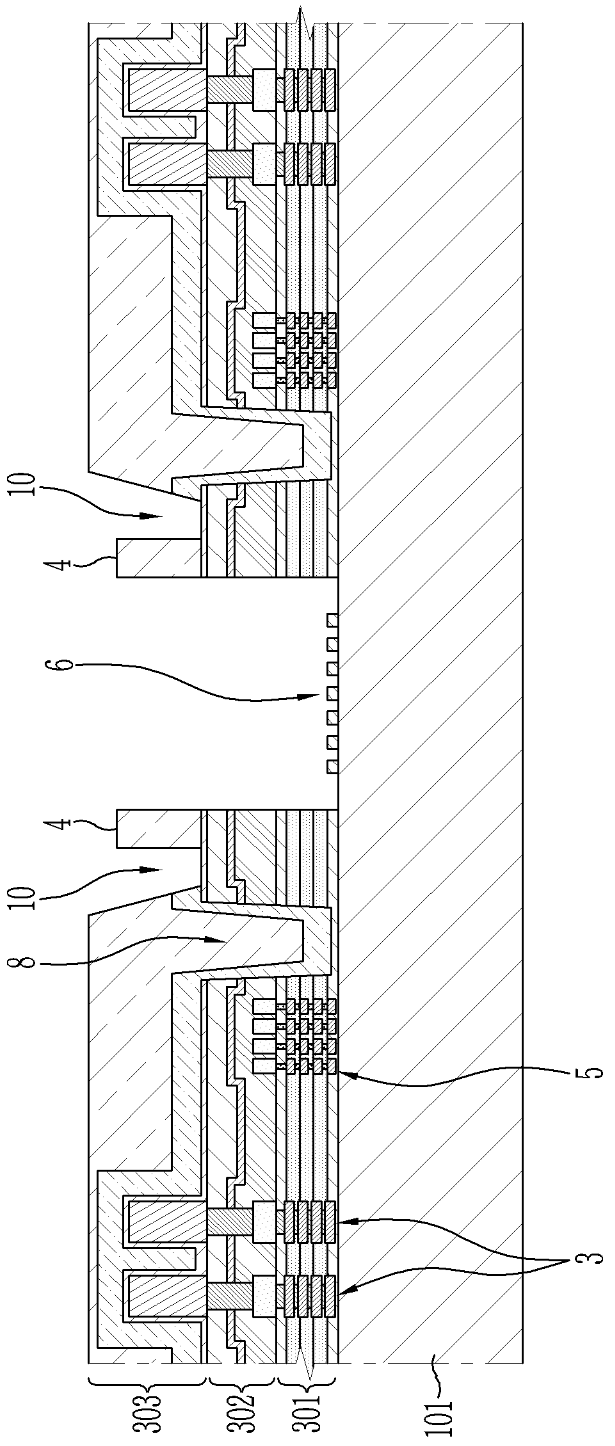
FIG. 4 is a cross-sectional view taken along line IV-IV in FIG. 2.
Figure 5:
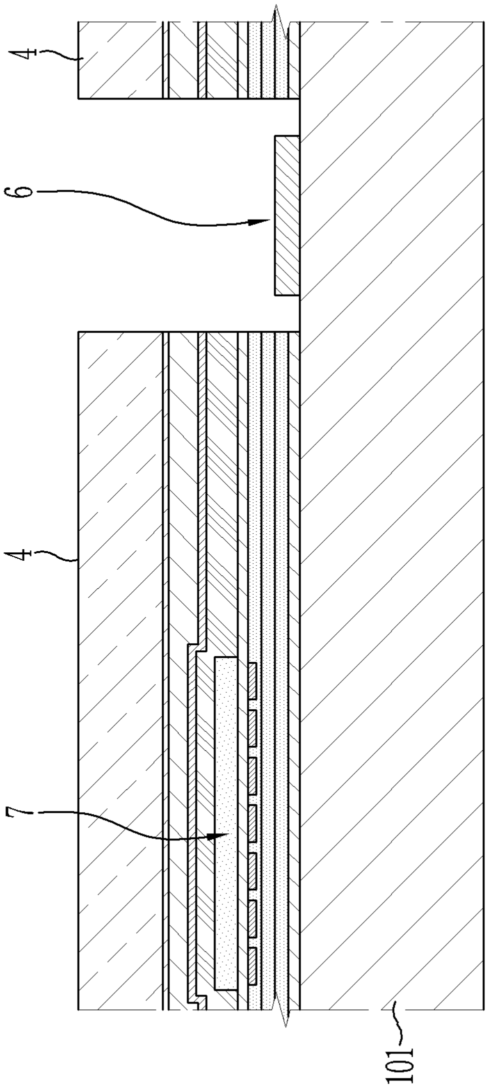
FIG. 5 is a cross-sectional view taken along line V-V in FIG. 2.

FIG. 1 illustrates a wafer having chips to be split by a mechanical method of splitting a semiconductor chip according to an embodiment. FIG. 2 is an enlarged view of part A in FIG. 1. FIG. 3 is a cross-sectional view taken along line III-III in FIG. 2. FIG. 4 is a cross-sectional view taken along line IV-IV in FIG. 2. FIG. 5 is a cross-sectional view taken along line V-V in FIG. 2.

With reference to FIG. 1, semiconductor chip areas 2, in which wires and various types of circuit elements such as transistors are formed, may be disposed in a matrix on a semiconductor wafer (substrate) 101. Cutout auxiliary layers 4 may be disposed around the chip areas 2. The cutout auxiliary layers 4 may not only be disposed between the chip areas 2 but also be disposed to completely surround the chip areas 2 positioned at an edge of the wafer 101. The chip areas 2 each include an active area in which a plurality of wiring layers and various types of circuit elements are disposed. A moistureproof structure 3 may be disposed at peripheral area of the chip area 2 to surround the active area. FIG. 1 illustrates that the semiconductor chip areas 2 each have a quadrangular shape and are arranged in a matrix. However, the shape of the semiconductor chip area 2 is not limited to a quadrangular shape, and the arrangement is not limited to a matrix. The cutout auxiliary layer 4 is also illustrated as having a band shape extending straight in horizontal and vertical directions, but the cutout auxiliary layer 4 is not limited thereto. The shape of the cutout auxiliary layer 4 may be variously modified to a curved or bent shape depending on the shape and arrangement of the semiconductor chip area 2.

With reference to FIGS. 2 to 5, the circuit elements such as transistors may be provided on the semiconductor substrate 101 made of silicon or the like. A chip wire made of metal, the moistureproof structure 3, a chip dam 5, an alignment key 6, a test element group (TEG) structure 7, the cutout auxiliary layer 4, and the like may be provided on the circuit elements. The chip wire, the chip dam 5, the moistureproof structure 3, the TEG structure 7, and the like may each include a plurality of layers. A low-permittivity insulating film 301 may be disposed between the plurality of layers and ensure insulation between metal lines. The moistureproof structure 3 may have a shape in which a plurality of metal layers is stacked without including the low-permittivity insulating film 301. The low-permittivity insulating film 301 may be a type of interlayer insulating film. The low-permittivity insulating film 301 may include a plurality of thin-films made of a dielectric material having lower permittivity than the permittivity of silicon oxide ($SiO_2$).

The chip wire may be a line that connects the circuit elements provided in the chip area 2 of the semiconductor substrate 101 or connects the circuit elements to the external elements. The TEG structure 7 may be a line provided to test or monitor the circuit element in the semiconductor chip area. The chip dam 5 may be a structure that reinforces a periphery of a scribing line to prevent a crack from propagating to the semiconductor chip area 2 and to allow the chip to be cut along the scribing line at the time of splitting the chip by means of scribing. The moistureproof structure 3 may be a structure formed along the peripheral area of the chip area 2 to prevent moisture from penetrating into the chip area 2. The chip dam 5 and the moistureproof structure 3 may be formed together with the chip wire or the TEG structure 7 at the time of forming the chip wire or the TEG structure 7.

An interlayer insulating film 302 may be disposed on the low-permittivity insulating film 301. The interlayer insulating film 302 may include a plurality of thin-films that insulates metal wiring layers disposed on the low-permittivity insulating film 301. The interlayer insulating film 302 may be made by, for example, repeatedly stacking silicon nitride (SiNx) and/or silicon oxide ($SiO_2$).

A gap-filling insulating film 303 and the cutout auxiliary layer 4 may be disposed on the interlayer insulating film 302. The gap-filling insulating film 303 may be made by, for example, repeatedly stacking silicon nitride (SiNx) and silicon oxide ($SiO_2$) such as tetraethoxysilane (TEOS). The cutout auxiliary layer 4 may include silicon oxide ($SiO_2$) such as tetraethoxysilane (TEOS). The gap-filling insulating film 303 may include a plurality of insulating films stacked, after a process of removing, by photo-etching, the low-permittivity insulating film 301 and the interlayer insulating film 302 between the chip dam 5 and the cutout auxiliary layer 4, so as to fill an insulating film gap 8 formed on an area between the chip dam 5 and the cutout auxiliary layer 4. The cutout auxiliary layer 4 may be disposed in a band shape in a splitting area in which the wafer 101 is split into the chip areas 2. A width of the cutout auxiliary layer may be greater than a cutting area 9 with which a cutting blade or scriber tip comes into contact during a scribing process or a sawing process. FIGS. 3 and 4 illustrate that an upper surface of the cutout auxiliary layer 4 is lower than an upper surface of the gap-filling insulating film 303. However, embodiments are not limited thereto. For example, the upper surface of the cutout auxiliary layer 4 and the upper surface of the gap-filling insulating film 303 may be formed at the same height.

The cutout auxiliary layer 4 may be disposed at a position at which the cutout auxiliary layer 4 overlaps the TEG structure 7 disposed in the splitting area. The entirety or a part of the TEG structure 7 may be disposed at a position that deviates from the cutout auxiliary layer 4. The cutout auxiliary layer 4 may be disposed at the periphery of the alignment key 6. The alignment key 6 may be disposed directly on the semiconductor substrate 101. An opening portion may be positioned above the alignment key 6 and formed by removing the low-permittivity insulating film 301 and the interlayer insulating film 302. The cutout auxiliary layer 4 may also have an opening portion at a position at which the cutout auxiliary layer 4 overlaps the alignment key 6. The alignment key 6 may be exposed upward through the opening portions.

A trench 10 may be disposed between the gap-filling insulating film 303 and the cutout auxiliary layer 4. The trench 10 may prevent contaminants, which are produced during sawing or scribing, from being diffused to the semiconductor the chip area 2.

As described above, when the mechanical machining such as sawing or scribing is performed in the state in which the cutout auxiliary layer 4 made of a material such as silicon oxide having predetermined hardness is wider than the cutting area 9 with which the cutting blade or scriber tip comes into contact, the blade or scriber tip may be sharpened during the machining, and the blade or scriber tip may be prevented from being abraded unevenly.

Figure 6:
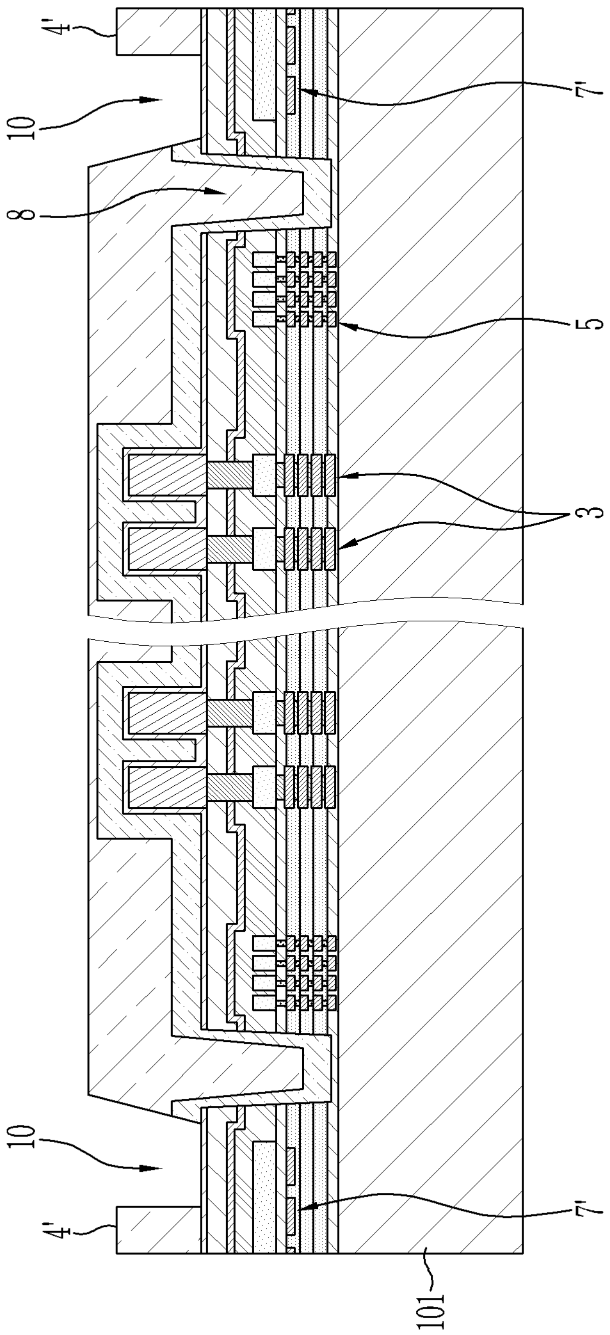
FIG. 6 is a cross-sectional view illustrating a portion of a semiconductor chip split by the method according to the embodiment, the portion corresponds to line III-III in FIG. 2.
Figure 7:
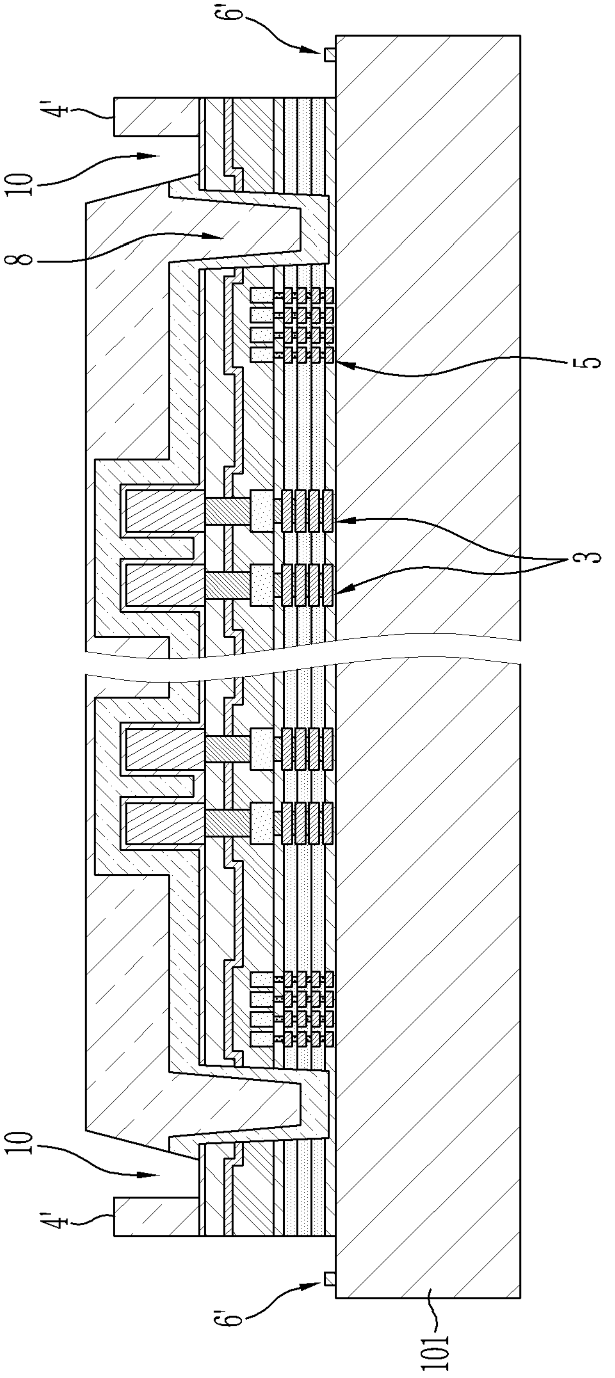
FIG. 7 is a cross-sectional view illustrating a portion of a semiconductor chip split by the method according to the embodiment, the portion corresponds to line IV-IV in FIG. 2.

FIG. 6 is a cross-sectional view illustrating a portion of a semiconductor chip split by the method according to the embodiment, the portion corresponds to line III-III in FIG. 2. FIG. 7 is a cross-sectional view illustrating a portion of a semiconductor chip split by the method according to the embodiment, the portion corresponds to line IV-IV in FIG. 2.

With reference to FIGS. 6 and 7, a semiconductor chip split by the method of splitting a semiconductor chip using mechanical machining according to the embodiment may have a cutout auxiliary layer residual portion 4' disposed along an outer periphery of the chip. The cutout auxiliary layer residual portion 4' may be disposed along the outer periphery of the semiconductor chip and may form a wall that surrounds the gap-filling insulating film 303. The cutout auxiliary layer residual portion 4' may have a shape such as a closed quadrangular shape in accordance with a shape of the semiconductor chip but may have a partially cut and opened shape. This is because the cutting area 9 may partially deviate from the cutout auxiliary layer 4 because of an alignment error or the like during the sawing or scribing.

The trench 10 may be disposed on an inner side of the chip with respect to the cutout auxiliary layer residual portion 4' in a horizontal direction. The trench 10 may be provided along the cutout auxiliary layer residual portion 4' and disposed inside an area surrounded by the cutout auxiliary layer residual portion 4'. The trench 10 may separate the cutout auxiliary layer residual portion 4' and the gap-filling insulating film 303.

The semiconductor chip split by the method of splitting a semiconductor chip using mechanical machining according to the embodiment may have a TEG structure residual portion 7' below the cutout auxiliary layer residual portion 4'. In addition, the semiconductor chip split by the method of splitting a semiconductor chip using mechanical machining according to the embodiment may include an alignment key residual portion 6' outside an area surrounded by the cutout auxiliary layer residual portion 4'. This is because the TEG structure 7 or the alignment key 6, which is present at a position deviating from the cutting area 9, may remain during the sawing or scribing.

The semiconductor chip may each include an active area in which a plurality of wiring layers and various types of circuit elements are disposed. The moistureproof structure 3 may be disposed at the peripheral area of the semiconductor chip to surround the active area. The chip dam 5 may be disposed outside the moistureproof structure 3 and surround the moistureproof structure 3. The insulating film gap 8 may be disposed outside the chip dam 5 and surround the chip dam 5. The trench 10 and the cutout auxiliary layer residual portion 4' may be disposed outside the insulating film gap 8.

As described above, the cutout auxiliary layer residual portion 4', the trench 10, and the alignment key residual portion 6' are present on the lateral surface of the semiconductor chip split by the method of splitting a semiconductor chip using mechanical machining according to the embodiment, such that it is possible to determine whether the semiconductor chip has been split based on a mechanical machining according to the embodiment.

Figure 8:
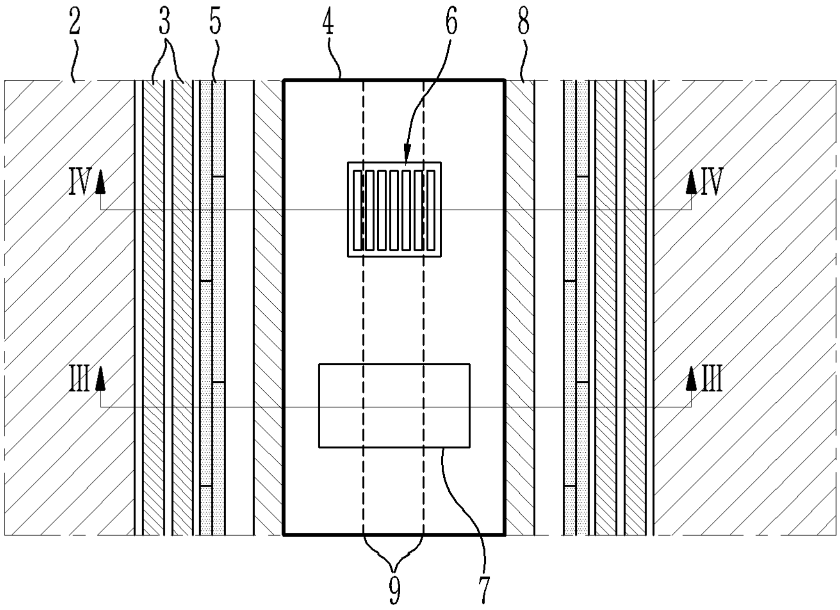
FIG. 8 is an arrangement view according to another embodiment.
Figure 9:
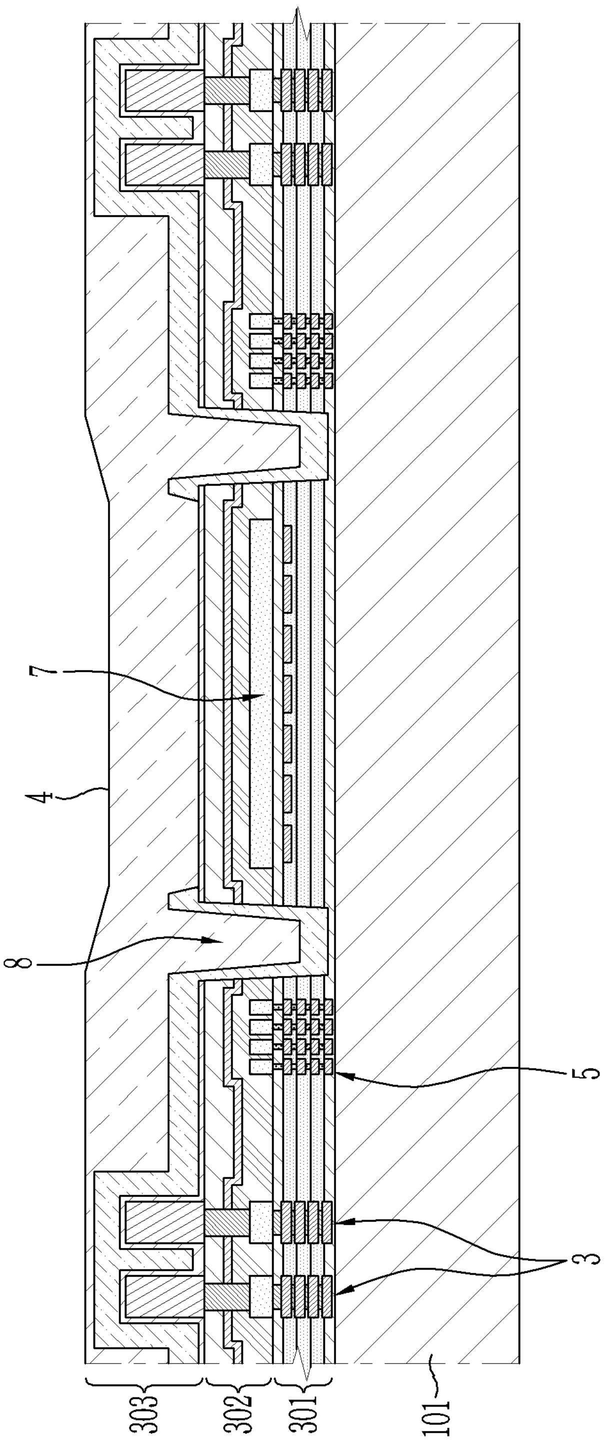
FIG. 9 is a cross-sectional view taken along line III-III in FIG. 8.
Figure 10:
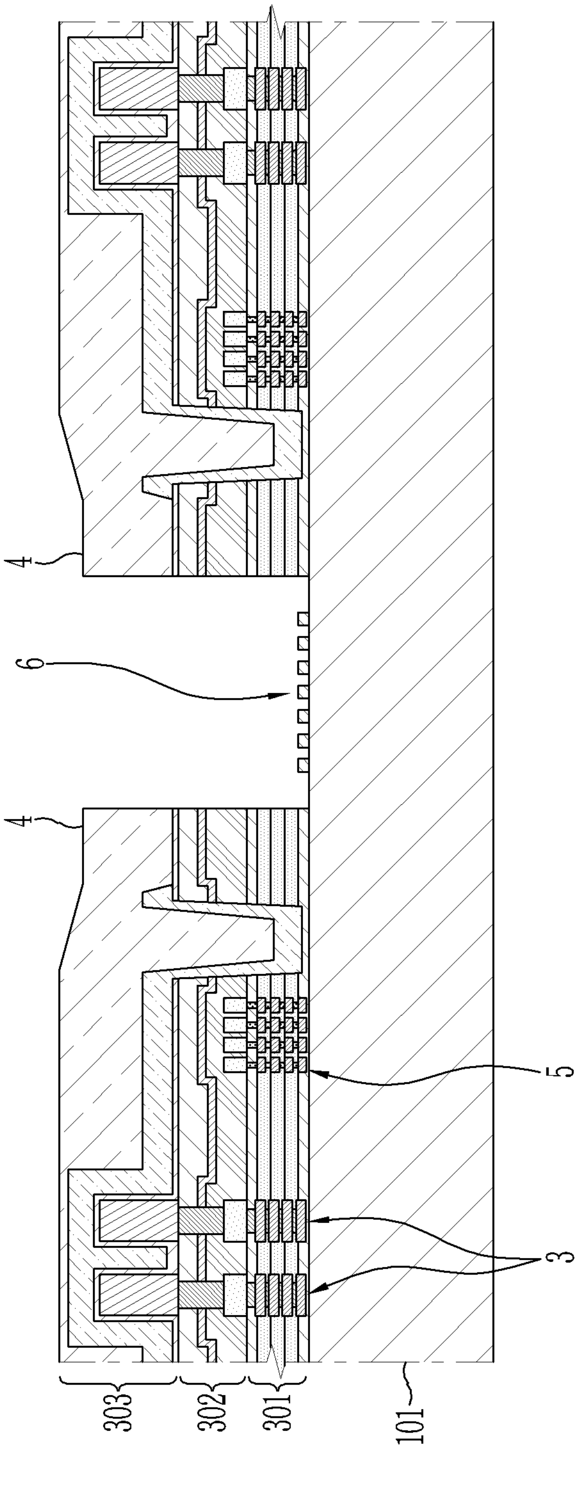
FIG. 10 is a cross-sectional view taken along line IV-IV in FIG. 8.

FIG. 8 is an arrangement view according to another embodiment, FIG. 9 is a cross-sectional view taken along line III-III in FIG. 8, and FIG. 10 is a cross-sectional view taken along line IV-IV in FIG. 8.

The embodiment illustrated in FIGS. 8 to 10 differs from the embodiment illustrated in FIGS. 2 to 5 in that the trench 10 for separating the cutout auxiliary layer 4 and the gap-filling insulating film 303 is not disposed. The cutout auxiliary layer 4 may be connected to an uppermost layer of the gap-filling insulating film 303. An upper surface of the cutout auxiliary layer 4 may be lower than an upper surface of the gap-filling insulating film 303 in a vertical direction. A number of films included in the cutout auxiliary layer 4 may be smaller than a number of films included in the gap-filling insulating film 303, or a thickness of the film of the cutout auxiliary layer 4 may be smaller than a thickness of the gap-filling insulating film 303. However, embodiments are not limited thereto. For example, according to the embodiment, the upper surface of the cutout auxiliary layer 4 and the upper surface of the gap-filling insulating film 303 may be formed at the same height in the vertical direction. The uppermost layer of the gap-filling insulating film 303 may be stacked, and then chemical mechanical polishing (CMP) may be performed, such that the cutout auxiliary layer 4 may be formed together with the uppermost layer of the gap-filling insulating film 303.

Figure 11:
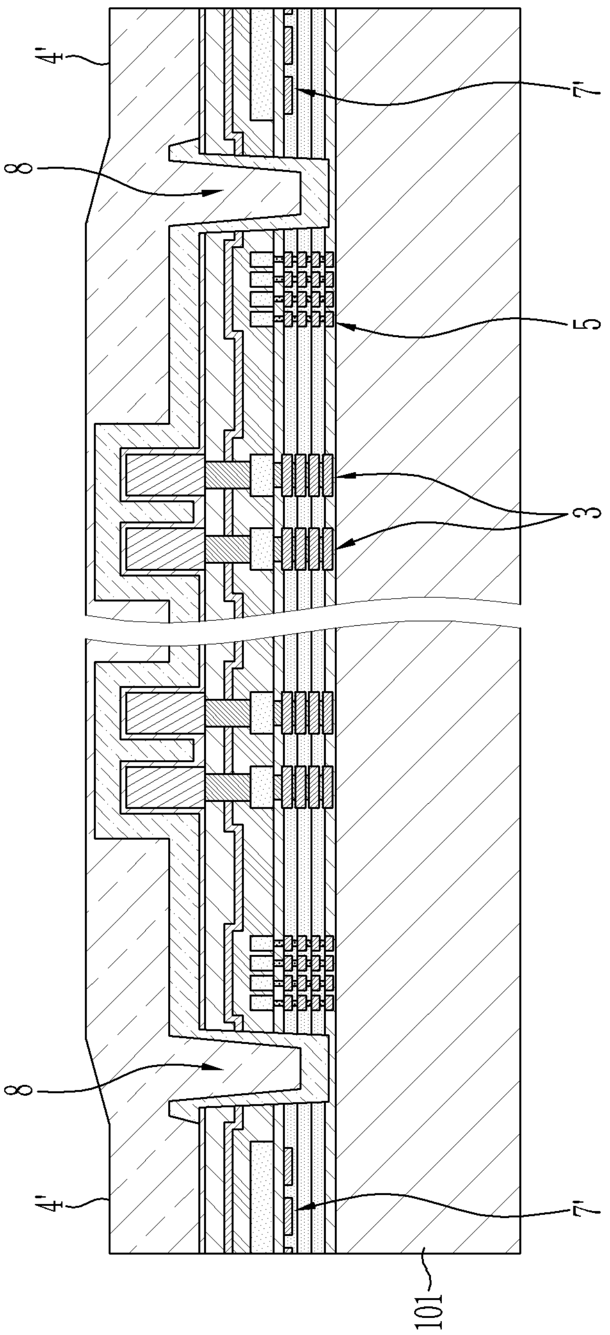
FIG. 11 is a cross-sectional view illustrating a portion of a semiconductor chip split by the method according to the another embodiment, the portion corresponds to line III-III in FIG. 8.
Figure 12:
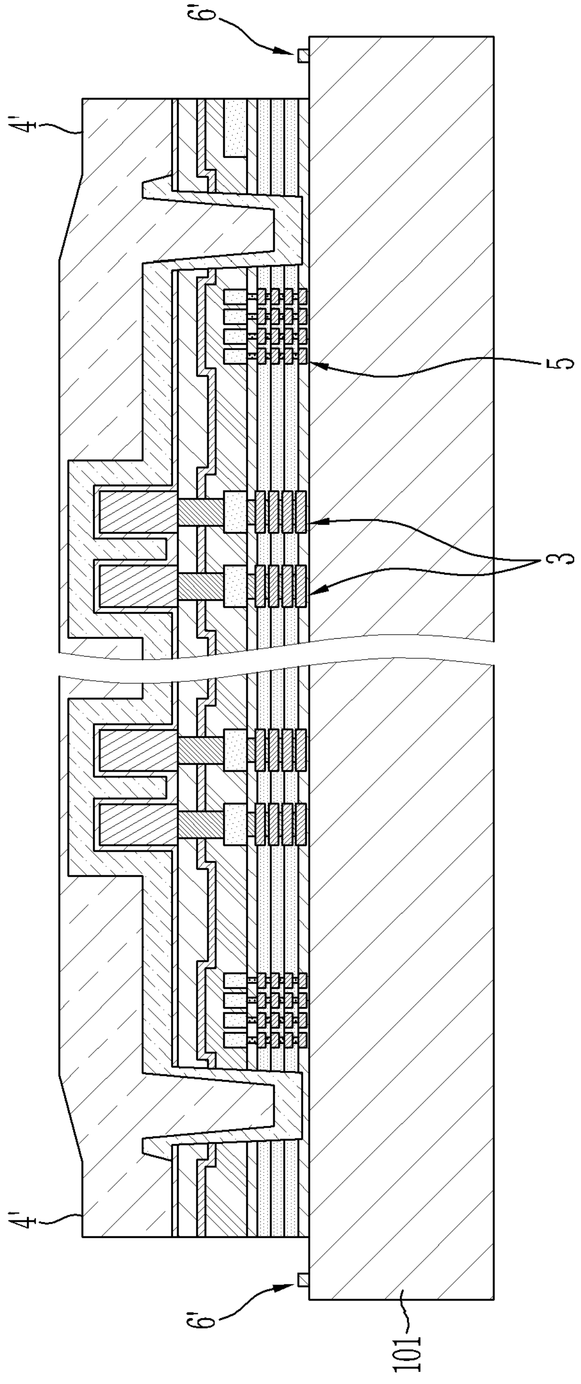
FIG. 12 is a cross-sectional view illustrating a portion of a semiconductor chip split by the method according to the another embodiment, the portion corresponds to line IV-IV in FIG. 8.

FIGS. 11 and 12 are cross-sectional views of the semiconductor chip split by the method of splitting a semiconductor chip using mechanical machining according to the embodiment in FIGS. 8 to 10, i.e., cross-sectional views corresponding to FIGS. 9 and 10.

The structure in FIGS. 11 and 12 differs from the structure in FIGS. 6 and 7 in that the trench 10 is not present. The cutout auxiliary layer residual portion 4' may fill the portion where the trench 10 was present. An upper surface of the cutout auxiliary layer residual portion 4' may be lower than the upper surface of the gap-filling insulating film 303. However, embodiments are not limited thereto. For example, the upper surface of the cutout auxiliary layer residual portion 4' and the upper surface of the gap-filling insulating film 303 may be formed at the same height in the vertical direction.

Figure 13:
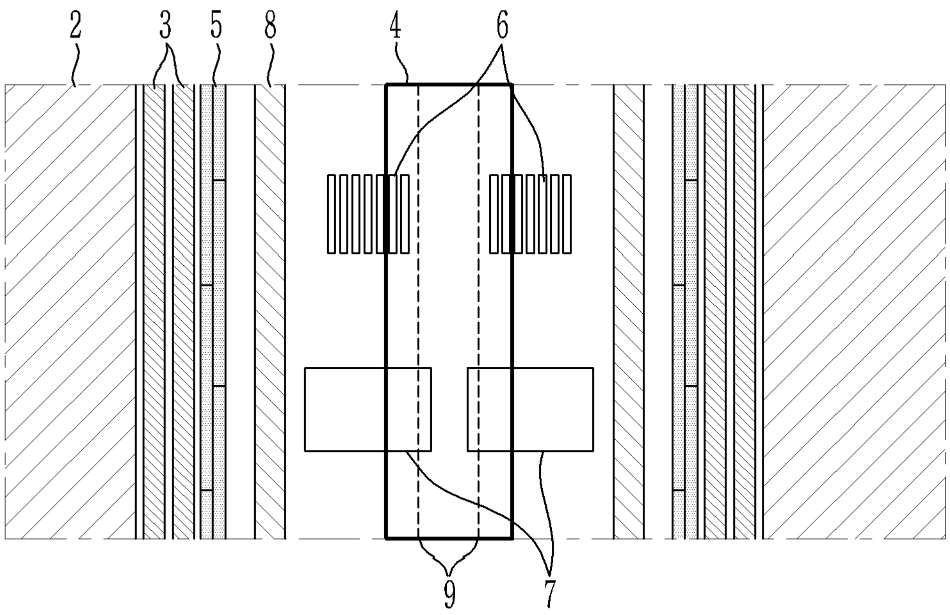
FIG. 13 is an arrangement view according to still another embodiment.

FIG. 13 is an arrangement view according to still another embodiment.

The embodiment in FIG. 13 differs from the embodiment in FIG. 2 in that the alignment key 6 and the TEG structure 7 may be disposed and distributed to two opposite left and right sides in the splitting area, and the cutout auxiliary layer 4 is disposed between the alignment key 6 and the TEG structure 7 at the two opposite left and right sides while partially overlapping the alignment key 6 and the TEG structure 7. With reference to FIG. 13, the cutout auxiliary layer 4 may also be disposed above the alignment key 6 and cover a part of the alignment key 6.

Figure 14:
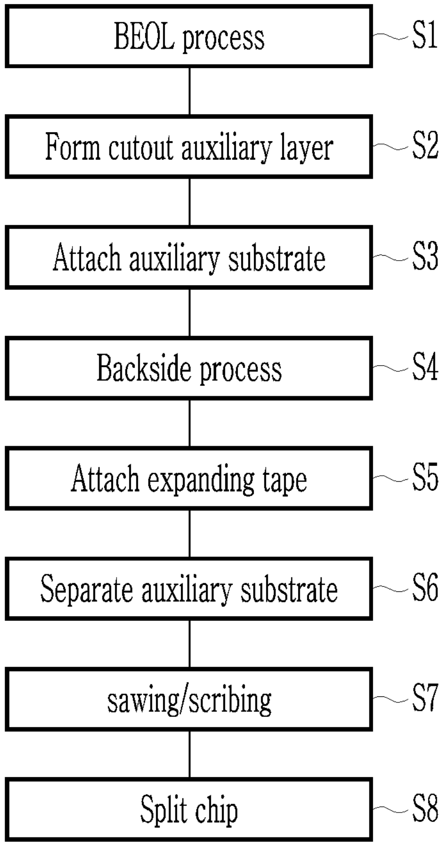
FIG. 14 is a process flowchart of the method of splitting a semiconductor chip using mechanical machining according to the embodiments.

FIG. 14 is a process flowchart of the method of splitting a semiconductor chip using mechanical machining according to an embodiment.

The method of splitting a semiconductor chip using mechanical machining according to the embodiment may include a back-end-of-line (BEOL) process (S1) of forming lines and various types of circuit elements such as transistors on the substrate 101, a cutout auxiliary layer forming process (S2), a sawing/scribing process (S7), and the like.

For example, with reference to FIGS. 2 to 5 and 14, the BEOL process (S1) may be performed to form at least some of the wires, various types of circuit elements such as transistors, the moistureproof structure 3, the chip dam 5, the alignment key 6, the TEG structure 7, the low-permittivity insulating film 301, the interlayer insulating film 302, and the gap-filling insulating film 303 on the semiconductor substrate 101.

The cutout auxiliary layer 4 and the trench 10 may be formed on a central portion of the splitting area (S2). The cutout auxiliary layer 4 may be made of a material such as silicon oxide ($SiO_2$) having predetermined hardness and formed by a method such as film stacking and photo-etching. The cutout auxiliary layer 4 may be formed together with the uppermost layer of the gap-filling insulating film 303.

An auxiliary substrate may be attached onto the gap-filling insulating film 303 (S3). The auxiliary substrate is a temporary structure that reinforces strength of the semiconductor substrate 101 and facilitates handling of the semiconductor substrate 101 when a backside process of processing a lower portion of the semiconductor substrate 101 is performed.

Next, the backside process may be performed on a back surface of the semiconductor substrate 101 (S3). The backside process may include at least one of an etching process of reducing a thickness of the semiconductor substrate 101, a process of forming a structure such as a through silicon via (TSV) or the like in the semiconductor substrate 101, and a backside electroplating process of forming a metal pattern such as a contact pad on a back surface of the semiconductor substrate 101. The backside plating process may be a metal structure forming process for implementing electrical connection between the chips at the time of bonding the chip to other chips by using a method such as hybrid compression bonding (HCB).

An expanding tape may be attached to the back surface of the semiconductor substrate 101 (S5).

The auxiliary substrate may be separated (S6).

A scribing line may be formed along the cutout auxiliary layer 4 by using a scriber, or sawing may be performed along the cutout auxiliary layer 4 by using a blade (S7). Foreign substances trapped between diamond particles disposed on the scriber tip or blade surface are removed while the cutout auxiliary layer 4 is machined, such that machining performance may be maintained or improved. In addition, irregular abrasion, which is uneven wear caused by one side or part of the scriber's leading edge or blade rubbing against a higher hardness material while the other side rubs against a lower hardness material, may be prevented.

The wafer including the semiconductor substrate 101 is frozen, and the expanding tape is expanded in all directions, such that the wafer may be split along the scribing line, and the semiconductor chip may be split (S8).

While embodiments have been described with reference to the figures, it will be understood by those of ordinary skill in the art that various changes in form and details may be made therein without departing from the spirit and scope as defined by the following claims and their equivalents.

What is claimed is:

1. A method of splitting a semiconductor chip, the method comprising:

performing a back-end-of-line (BEOL) process comprising:

forming a plurality of chip areas on a semiconductor substrate;

forming a splitting area, which separates the plurality of chip areas, on the semiconductor substrate; and forming a wire on a first surface of the semiconductor substrate;

forming a cutout auxiliary layer in the splitting area of the first surface of the semiconductor substrate; and performing mechanical machining by bringing a mechanical machining device into contact with the cutout auxiliary layer, wherein the cutout auxiliary layer is adjacent to the plurality of chip areas, wherein the forming the cutout auxiliary layer comprises forming a trench between the plurality of chip areas and the cutout auxiliary layer in a horizontal direction, wherein the performing the BEOL process further comprises forming an interlayer insulating film and a gap-filling insulating film at least partially above the plurality of chip areas and the splitting area of the semiconductor substrate, and wherein the forming the cutout auxiliary layer further comprises forming an upper surface of the cutout auxiliary layer and an upper surface of an uppermost layer of the gap-filling insulating film at a same level in a vertical direction.

2. The method of claim 1, wherein the cutout auxiliary layer comprises silicon.

3. The method of claim 2, wherein the cutout auxiliary layer comprises tetraethoxysilane (TEOS).

4. The method of claim 1, wherein the performing the BEOL process further comprises forming a test element group (TEG) structure and an alignment key below the cutout auxiliary layer.

5. The method of claim 4, wherein the cutout auxiliary layer has an opening portion exposing at least a part of the alignment key.

6. The method of claim 1, wherein the cutout auxiliary layer is formed together with the uppermost layer of the gap-filling insulating film.

7. The method of claim 1, wherein the mechanical machining comprises at least one of sawing based on a blade and scribing based on a scriber.

8. The method of claim 7, wherein a width of the cutout auxiliary layer is larger than a width of a cutting area with which a tip of the blade or the scriber comes into contact.

9. The method of claim 1, between the forming the cutout auxiliary layer and the performing the mechanical machining, further comprising:

attaching an auxiliary substrate on a front surface of the semiconductor substrate;

performing a backside process on a back surface of the semiconductor substrate;

attaching an expanding tape on a back surface of the auxiliary substrate; and separating the auxiliary substrate.

10. A semiconductor chip comprising:

a semiconductor substrate;

a plurality of chip areas on the semiconductor substrate;

a splitting area between the plurality of chip areas;

a plurality of wiring layers on the semiconductor substrate;

a plurality of interlayer insulating films between the plurality of wiring layers;

a plurality of gap-filling insulating films on the plurality of interlayer insulating films, the plurality of gap-filling insulating films being at least partially above the plurality of chip areas and the splitting area of the semiconductor substrate;

a cutout auxiliary layer residual portion on the plurality of interlayer insulating films in the splitting area; and a trench between the plurality of chip areas and the cutout auxiliary layer residual portion in a horizontal direction, wherein the cutout auxiliary layer residual portion extends along an outer periphery of the semiconductor substrate and surrounds the plurality of gap-filling insulating films, and wherein an upper surface of the cutout auxiliary layer residual portion and an upper surface of an uppermost layer of each gap-filling insulating film of the plurality of gap-filling insulating films are at a same level in a vertical direction.

11. The semiconductor chip of claim 10, wherein the trench is between the gap-filling insulating films and the cutout auxiliary layer residual portion.

12. The semiconductor chip of claim 10, wherein the cutout auxiliary layer residual portion comprises tetraethoxysilane (TEOS).

13. The semiconductor chip of claim 10, further comprising a TEG structure residual portion and an alignment key residual portion below the cutout auxiliary layer residual portion.

14. The semiconductor chip of claim 13, wherein the alignment key residual portion is disposed at a position deviating from an area surrounded by the cutout auxiliary layer residual portion.

15. A semiconductor chip comprising:

a semiconductor substrate;

a plurality of chip areas on the semiconductor substrate;

a splitting area between the plurality of chip areas;

an active chip area comprising a plurality of wiring layers and a plurality of circuit elements on the semiconductor substrate;

a moistureproof structure adjacent to the active chip area;

a chip dam adjacent to the moistureproof structure;

a plurality of interlayer insulating films between the plurality of wiring layers;

a plurality of gap-filling insulating films on the plurality of interlayer insulating films, the plurality of gap-filling insulating films being at least partially above the plurality of chip areas and the splitting area of the semiconductor substrate;

a cutout auxiliary layer residual portion on the plurality of interlayer insulating films; and a trench between the plurality of gap-filling insulating films and the cutout auxiliary layer residual portion, the trench being between the active chip area and the cutout auxiliary layer residual portion in a horizontal direction, wherein the cutout auxiliary layer residual portion extends along an outer periphery of the semiconductor substrate and surrounds the plurality of gap-filling insulating films, and wherein an upper surface of the cutout auxiliary layer residual portion and an upper surface of an uppermost layer of each gap-filling insulating film of the plurality of gap-filling insulating films are at a same level in a vertical direction.

* * * * *